United States Patent
Anderson et al.

(10) Patent No.: US 7,964,467 B2
(45) Date of Patent: Jun. 21, 2011

(54) METHOD, STRUCTURE AND DESIGN STRUCTURE FOR CUSTOMIZING HISTORY EFFECTS OF SOI CIRCUITS

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 573 days.

(21) Appl. No.: 12/055,600

(22) Filed: Mar. 26, 2008

(65) Prior Publication Data
US 2009/0242985 A1    Oct. 1, 2009

(51) Int. Cl.
*H01L 21/762* (2006.01)
(52) U.S. Cl. .. 438/296; 438/279; 257/520; 257/E21.546
(58) Field of Classification Search .................. 438/221, 438/296, 361; 257/508, 510, 513, 514, 515, 257/520, E21.546
See application file for complete search history.

(56) References Cited

U.S. PATENT DOCUMENTS

| | | | |
|---|---|---|---|
| 4,416,405 A | 11/1983 | Caillouet | |
| 5,536,950 A | 7/1996 | Liu et al. | |
| 5,747,353 A | 5/1998 | Bashir et al. | |
| 5,777,362 A | 7/1998 | Pearce | |
| 5,844,285 A | 12/1998 | Kwon | |
| 5,962,895 A | 10/1999 | Beyer et al. | |
| 6,124,613 A | 9/2000 | Kokubun | |
| 6,156,589 A | 12/2000 | Noble | |
| 6,268,630 B1 | 7/2001 | Schwank et al. | |
| 6,300,657 B1 | 10/2001 | Bryant et al. | |
| 6,307,237 B1 | 10/2001 | Erstad | |
| 6,406,945 B1 | 6/2002 | Lee et al. | |
| 6,429,477 B1 | 8/2002 | Mandelman et al. | |
| 6,429,487 B1 | 8/2002 | Kunikiyo | |
| 6,488,618 B1 | 12/2002 | Paolitto et al. | |
| 6,492,695 B2 | 12/2002 | Lutze | |
| 6,498,371 B1 | 12/2002 | Krishnan et al. | |
| 6,506,654 B1 | 1/2003 | Wei et al. | |
| 6,514,808 B1 | 2/2003 | Samavedam et al. | |
| 6,550,651 B1 | 4/2003 | Murdoch et al. | |
| 6,624,459 B1 | 9/2003 | Dachtera et al. | |
| 6,627,511 B1 | 9/2003 | Racanelli et al. | |
| 6,630,376 B1 | 10/2003 | Krishnan et al. | |
| 6,633,067 B2 | 10/2003 | Noble | |

(Continued)

FOREIGN PATENT DOCUMENTS
JP    2004-207517    7/2004

OTHER PUBLICATIONS

Office Action dated Feb. 7, 2011 in U.S. Appl. No. 12/055,686.

(Continued)

*Primary Examiner* — David Vu
*Assistant Examiner* — Earl N Taylor
(74) *Attorney, Agent, or Firm* — Richard Kotulak; Roberts Mlotkowski Safran & Cole, P.C.

(57) ABSTRACT

A design structure is embodied in a machine readable medium for designing, manufacturing, or testing a design. The design structure includes a high-leakage dielectric formed between a gate electrode and an outer portion of an active region of a FET. Also provided is a structure having a high-leakage dielectric formed between the gate electrode and the active region of the FET and a method of manufacturing such structure.

12 Claims, 7 Drawing Sheets

U.S. PATENT DOCUMENTS

| | | |
|---|---|---|
| 6,642,579 B2 | 11/2003 | Fung |
| 6,666,545 B2 | 12/2003 | Liu et al. |
| 6,670,675 B2 | 12/2003 | Ho et al. |
| 6,677,645 B2 | 1/2004 | Bryant et al. |
| 6,724,048 B2 | 4/2004 | Min et al. |
| 6,740,551 B2 | 5/2004 | Yoshida et al. |
| 6,815,282 B2 | 11/2004 | Dachtera et al. |
| 6,868,000 B2 | 3/2005 | Chan et al. |
| 6,911,010 B2 | 6/2005 | Dirks et al. |
| 6,939,752 B1 | 9/2005 | Liu et al. |
| 6,940,130 B2 | 9/2005 | Bryant et al. |
| 6,953,738 B2 | 10/2005 | Veeraraghavan et al. |
| 6,960,810 B2 | 11/2005 | Fechner |
| 6,992,358 B2 * | 1/2006 | Hieda et al. .................. 257/407 |
| 7,078,773 B2 | 7/2006 | Chan et al. |
| 7,192,816 B2 | 3/2007 | Fechner |
| 7,244,640 B2 | 7/2007 | Yang et al. |
| 7,269,860 B2 | 9/2007 | Dennis et al. |
| 7,632,745 B2 | 12/2009 | Chen |
| 2002/0011612 A1 * | 1/2002 | Hieda .......................... 257/262 |
| 2002/0022360 A1 * | 2/2002 | Kim et al. ..................... 438/637 |
| 2002/0040998 A1 * | 4/2002 | Lee ............................... 257/347 |
| 2005/0121703 A1 * | 6/2005 | Hieda et al. ................... 257/288 |
| 2005/0269634 A1 * | 12/2005 | Bojarczuk et al. ............. 257/338 |
| 2005/0269635 A1 * | 12/2005 | Bojarczuk et al. ............. 257/338 |
| 2005/0269648 A1 | 12/2005 | Basceri et al. |
| 2007/0063277 A1 | 3/2007 | Belyansky et al. |
| 2008/0064194 A1 | 3/2008 | Hong |
| 2009/0242985 A1 * | 10/2009 | Anderson et al. ............. 257/347 |
| 2009/0243000 A1 * | 10/2009 | Anderson et al. ............. 257/411 |
| 2009/0243029 A1 * | 10/2009 | Anderson et al. ............. 257/506 |

OTHER PUBLICATIONS

Colombo, L. et al., "Gate Dielectric Process Technology for the Sub-1 nm Equivalent Oxide Thickness (EOT) Era", The Electrochemical Society Interface, Fall 2007, pp. 51-55.

Final Office Action dated Nov. 26, 2010 in U.S. Appl. No. 12/055,622.

Office Action dated Jun. 11, 2010 in U.S. Appl. No. 12/055,622.

Chen, S. et al., "High-performance poly crystalline silicon thin-film transistors...", Sep. 20, 2006, ELSEVIER ScienceDirect, Thin Solid Films 515, 2006, pp. 1112-1116.

* cited by examiner

METHOD, STRUCTURE AND DESIGN STRUCTURE FOR CUSTOMIZING HISTORY EFFECTS OF SOI CIRCUITS

FIELD OF THE INVENTION

The present invention generally relates to a structure for customizing history effects of a transistor, a design structure and method of manufacture, and more particularly, to a structure selectively using a high-leakage dielectric to customize for leakage history effects of a circuit, a design structure for customizing leakage history effects of a circuit and a method of manufacturing such structure.

BACKGROUND OF THE INVENTION

History effect in SOI circuits can lead to less-than-optimal delay-vs.-power circuits due to elevated stimulated leakage and worst-case-history timing for applications. More specifically, Partially-Depleted Silicon On Insulator (PDSOI) technology features a "floating body'" which can be described as a region of silicon beneath the FET channel which is undepleted of its equilibrium carrier concentration, and is largely electrically neutral. This floating body will vary in electric potential (voltage) with use of the transistor.

There are two types of effects that determine the body potential, namely leakage sources, which are static in nature, and capacitive coupling, which is intrinsically transient in its influence on body voltage. The two effects taken with the recent electrical states of a PDSOI FET determine the body voltage.

As the body voltage varies, the FET threshold-voltage (Vt), and hence, the drive currents are influenced. The final outcome of such variations is that the detailed performance of a circuit employing PDSOI will be a function of the most-recent history of use of the circuit. For example, if the circuit has been inactive for some time greater than the relaxation times of the FETs, then the performance will be characteristic of that obtained with body voltages at equilibrium. This is the so-called first-switch state.

By contrast, if the same circuit is stimulated a short-time after the "first-switch" event (i.e., a time significantly less than the relaxation times of the FET body voltage), the body voltages will have been perturbed from the equilibrium values by capacitive coupling from source, drain, and gate, to the body. This will result in a different set of body voltages and, hence, a different, "second-switch," performance will be characteristic of the circuit.

Using the first and second switch events, the history can be defined as:

$$\text{History} = [T1 - T2] / [(\tfrac{1}{2}) * (T1 + T2)]$$

where T1=1st switch delay and T2=2nd switch delay. And, the gate-to-body leakage can affect history in two ways:
1. For T1, the load device has its 1st-switch Vt lowered (closer to zero) which causes the load FET to buck the transition more effectively and hence increase the value of T1; and
2. In the second switch, the body of the load device is unaffected, while the active device now has a more forward-biased body, and hence is faster.

Thus the second switch becomes faster with increasing gate-to-body leakage, so the net is that history becomes more positive.

However, to minimize variability, and to maximize switching speed per unit power, it is desirable to minimize history, i.e. History=0. To do this, current technology optimizes the circuit by minimizing history, averaged over typical use conditions. But differing history behavior by circuit topology (e.g., inverter, vs. nand, nor, pass-gate, et cetera) has left a wide range of history-effect within a real product.

Accordingly, there exists a need in the art to overcome the deficiencies and limitations described hereinabove.

SUMMARY OF THE INVENTION

In a first aspect of the invention, a structure comprises a high-leakage dielectric formed between a gate electrode and an outer portion of an active region of a FET.

In an additional aspect of the invention, a method comprises forming a high-leakage dielectric between a gate electrode and an active region of a device, and forming a low-leakage dielectric over at least a portion of the device.

In a further aspect of the invention, a design structure for adjusting and/or customizing history effects of a circuit is embodied in a machine readable medium for designing, manufacturing, or testing an integrated circuit. The design structure comprises a high-leakage dielectric formed between a gate electrode and an outer portion of an active region of a FET.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention generally relates to a structure for customizing history effects of a transistor, a design structure and method of manufacture. More specifically, the present invention is directed to a structure using a higher-leakage dielectric, typically comprising a lower-k dielectric, to customize for leakage history effects of a circuit, a design structure for customizing leakage history effects of a circuit and a method of manufacturing such structure. By implementing the invention, it is possible to enable design-modified gate-to-body leakage, which is known to alter history effect. More specifically, the present invention provides the ability to adjust (customize) the history effects of a circuit in order to tailor individual circuits, and to the use of the circuits to provide benefits by reducing variability and delay of the circuit. In this way, it is possible to obtain both the best performance (e.g., smallest circuit delay) and the least variability of delay in CMOS circuits.

Structure and Fabrication Processes

Figure 1:
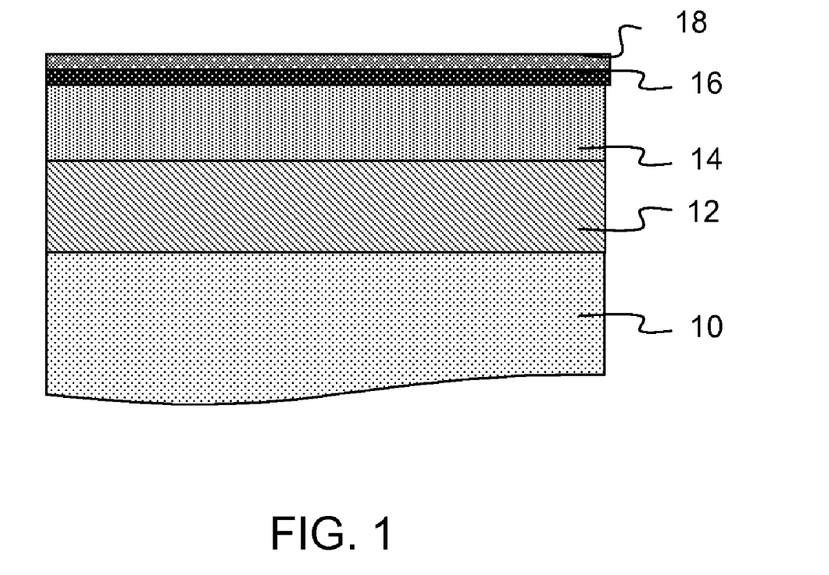
FIG. 1 represents a beginning structure and processes for fabricating the structure in accordance with the invention.

FIG. 1 represents a beginning structure and processes for fabricating the structure in accordance with the invention. More specifically, FIG. 1 shows a BOX layer 12 formed on a conventional substrate 10 such as silicon (e.g., wafer body). In non-limiting illustrative embodiments, the silicon layer 10 is between about 100 to 650 nanometers and the BOX layer 12 is between about 100 to 1000 nanometers. An active silicon layer 14 is formed on the BOX layer 12 to form a conventional wafer. As should be understood by those of skill in the art, the active silicon layer 14 will be employed to form a floating body of the FET.

Still referring to FIG. 1, the wafer is subject to an oxidation process, which forms a silicon dioxide ($SiO_2$) layer 16 (pad film). The $SiO_2$ layer 16 can range in thickness depending on its application. More specifically, in one illustrative non-limiting example, the $SiO_2$ layer 16 can range in thickness from about 100 Å to 600 Å. A Silicon Nitride ($Si_3N_4$) layer 18 (pad film) is deposited on the $SiO_2$ layer 16 layer in a conventional deposition process. The $Si_3N_4$ layer 18 is preferably $Si_3N_4$ with a thickness of about 200 Å to 1200 Å; although, other thicknesses are also contemplated by the invention.

Figure 2:
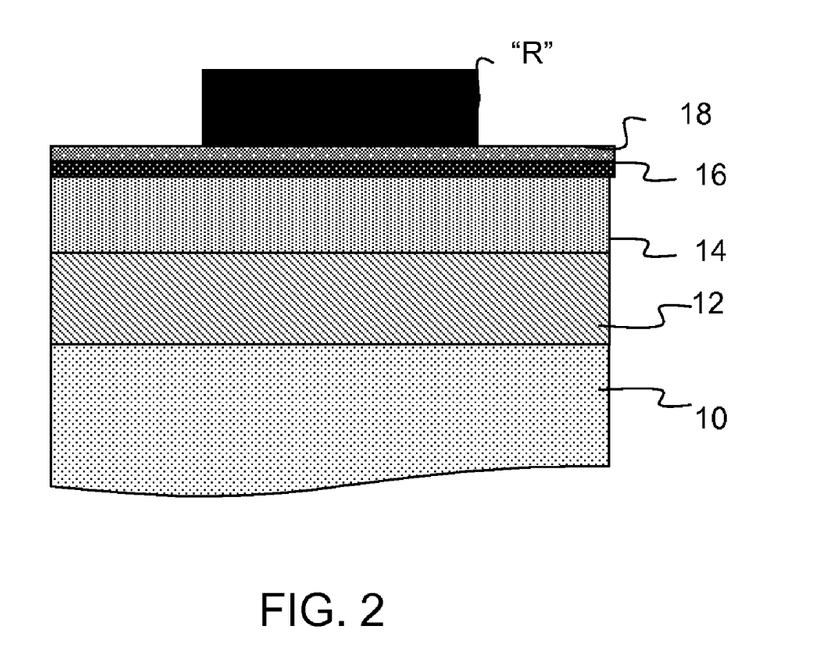
FIGS. 2-10 represent intermediate and final structures and respective processes for fabricating the structure in accordance with the invention.

As shown in FIG. 2, a resist "R" is selectively patterned on the $Si_3N_4$ layer 18 to form openings. The resist R can be patterned in any conventional manner such as, for example, exposing the resist R to a light source, followed by selective chemical removal. For example, a mask material (not shown) may be deposited over the resist R at selective portions. Once the mask is formed, using conventional photolithographic processes, holes can be opened to expose portions of the SiN layer 18.

Figure 3:
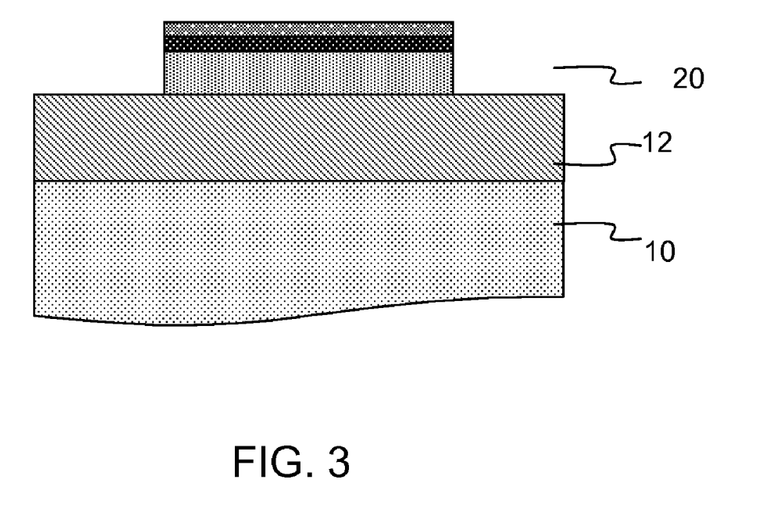

As shown in FIG. 3, the exposed portions of the $Si_3N_4$ layer 18 are etched using a conventional reactive ion etching process. The etching continues to the BOX layer 12, which results in the formation of trenches 20. More specifically, using conventional etching processes such as, for example, Reactive Ion Etching (RIE), trenches 20 can be formed through the $Si_3N_4$ layer 18, $SiO_2$ layer 16 and active silicon 14. In further processes, the resist will be stripped away resulting in the structure of FIG. 3.

Figure 4:
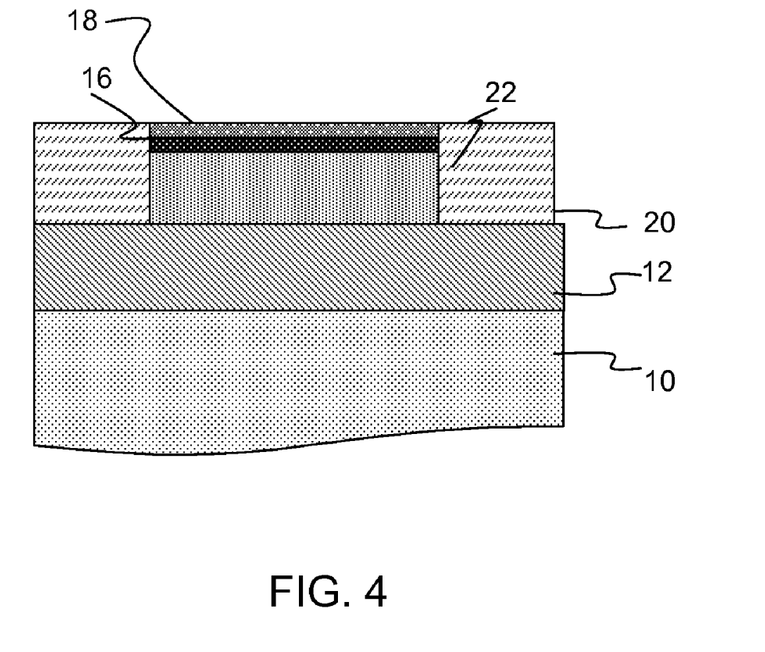

In FIG. 4, a silicon dioxide is deposited into the trenches 22 to form STI structures. After the deposition process, the structure of FIG. 4 is planarized to the top of the SiN layer 18. This forms a nearly planar top surface of the structure.

Figure 5:
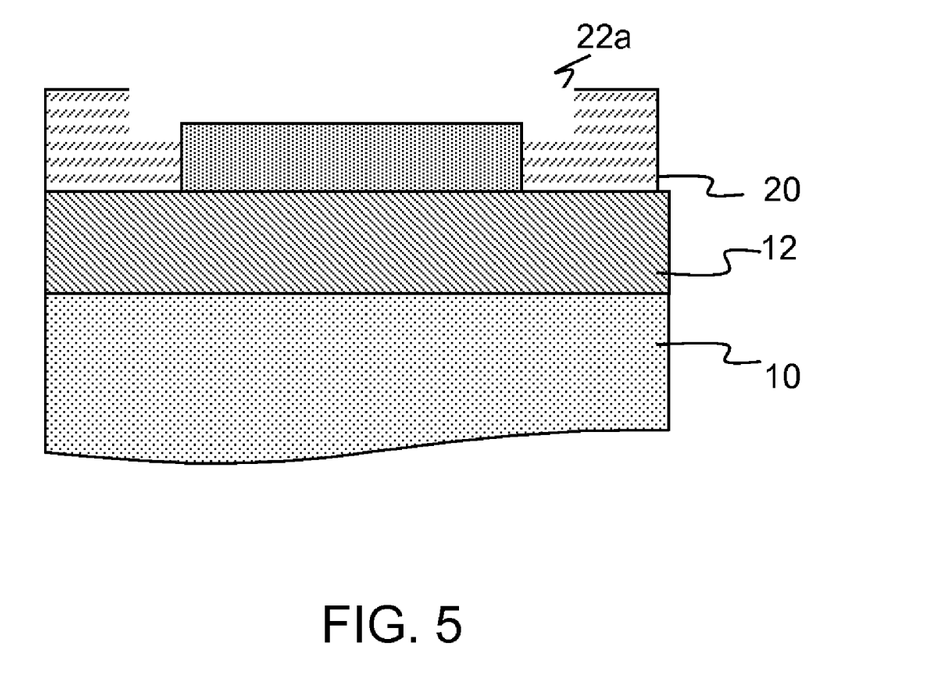

In FIG. 5 the silicon dioxide ($SiO_2$) layer 16 and Silicon Nitride (SiN) layer 18 are removed using a conventional process. Recesses 22a form incidentally to the removal of the silicon dioxide ($SiO_2$) layer 16 and Silicon Nitride (SiN) layer 18.

Figure 6:
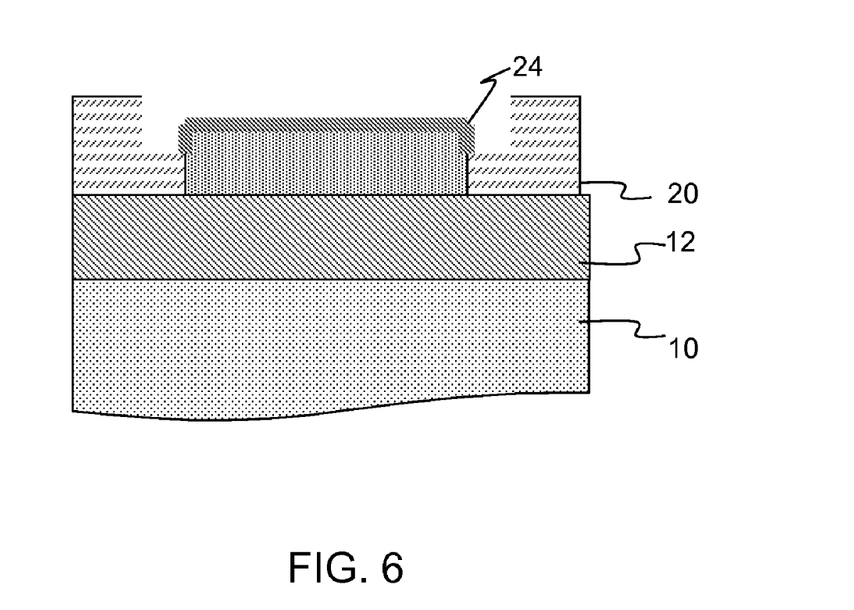

In FIG. 6, a high-leakage dielectric material 24 is grown on the exposed active silicon layer 14 (including within the recesses 22a). In embodiments, the high-leakage dielectric material 24 is an oxynitride and more specifically $SiO_2$—SiO—N. In embodiments, the high-leakage dielectric material 24 is grown to a thickness of approximately 0.7 to 2 nanometers. As should be understood by those of skill in the art, the high-leakage dielectric material 24 selectively grows on silicon and hence, is directly adjacent to and abutting the trench-fill material 20.

Figure 7:
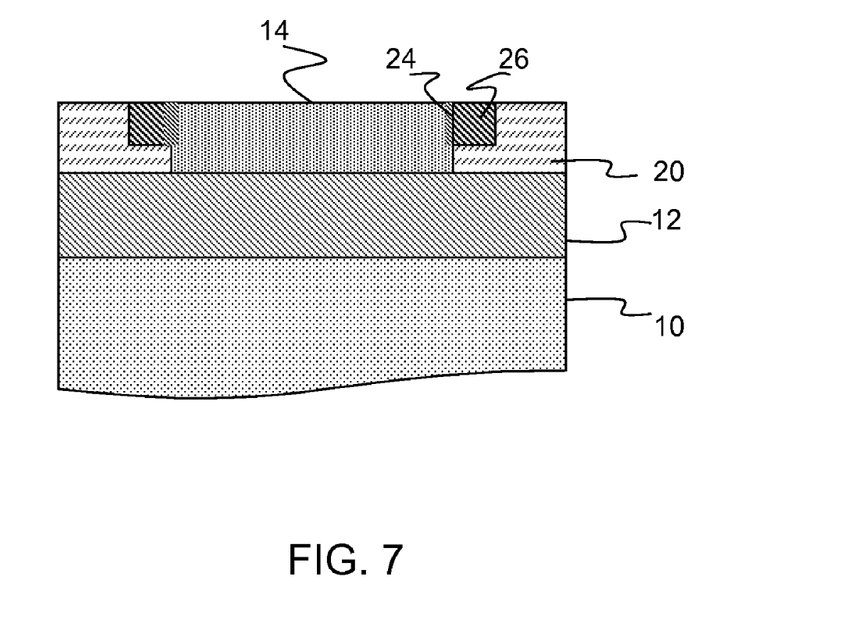

FIG. 7 shows a deposition of a gate electrode material 26 in the gate recesses 22a using known deposition processes, e.g., conventional CVD process. The gate electrode material 26 may be any conventional gate electrode material such as, for example, a doped polysilicon material. In still further embodiments, the gate electrode material 26 can be any metal layer or metal silicide layer, e.g., Tungsten Silicide, Titanium Silicide or Cobalt Silicide. In embodiments, the gate electrode material 26 completely fills the recesses 22a, abutting against low-leakage dielectric 24. The structure of FIG. 7 is then planarized to remove any excess gate electrode material 26 and the high-leakage dielectric 24 on the top surface of the active silicon layer 14.

As shown in FIG. 7, the high-leakage dielectric 24 remains within portions of the trenches between the gate electrode material 26 and the active silicon 14 in order adjust or customize the history effect of the circuit, e.g., adjust the leakage of the circuit. That is, by maintaining the high-leakage dielectric 24 adjacent the active silicon layer (e.g., floating body), it is possible to adjust and/or customize the leakage from the gate electrode through the gate dielectric to the floating body.

Figure 8:
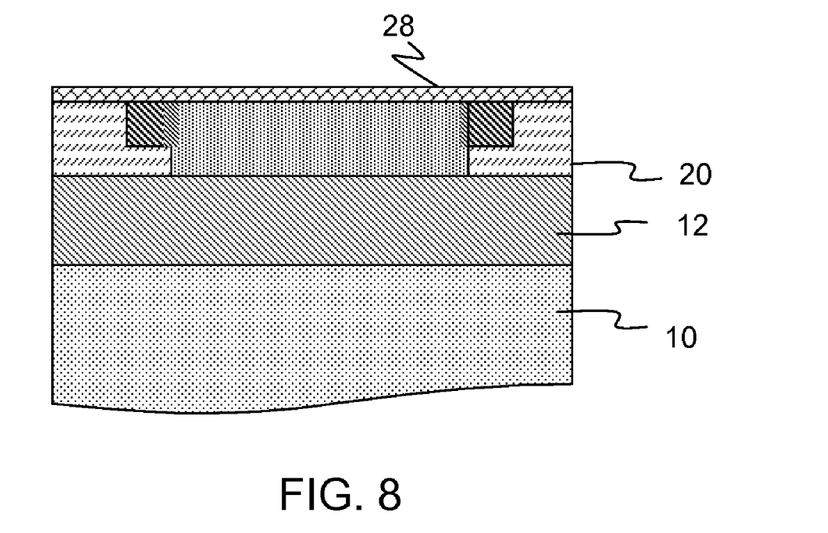

In FIG. 8, a low-leakage dielectric 28 is formed on the surface of the structure of FIG. 7. In embodiments, the low-leakage dielectric 28 is a high-k material such as, for example, $HfO_2$ or $HfSiO_4$. In embodiments, the low-leakage dielectric is about 2 to 5 nanometers in thickness. In embodiments, the history effect of the device can be customized by adjusting the ratio of high-leakage dielectric 24 to the low-leakage dielectric 28.

Figure 9:
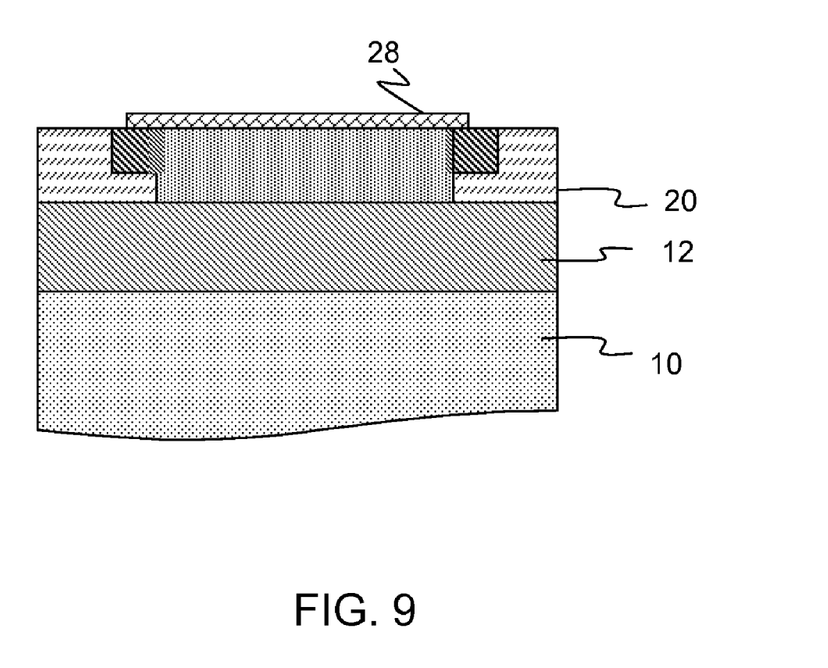

In FIG. 9, a resist (not show) is formed over the structure of FIG. 8. In embodiments, the resist is patterned in any conventional manner such as, for example, exposing the resist to a light source. After patterning, an etching process etches portions of the low-leakage dielectric 28 to form the structure of FIG. 9. In embodiments, the low-leakage dielectric 28 will extend slightly over the gate electrode material 26, although it is also contemplated that the low-leakage dielectric 28 may also be etched away at such location.

Figure 10:
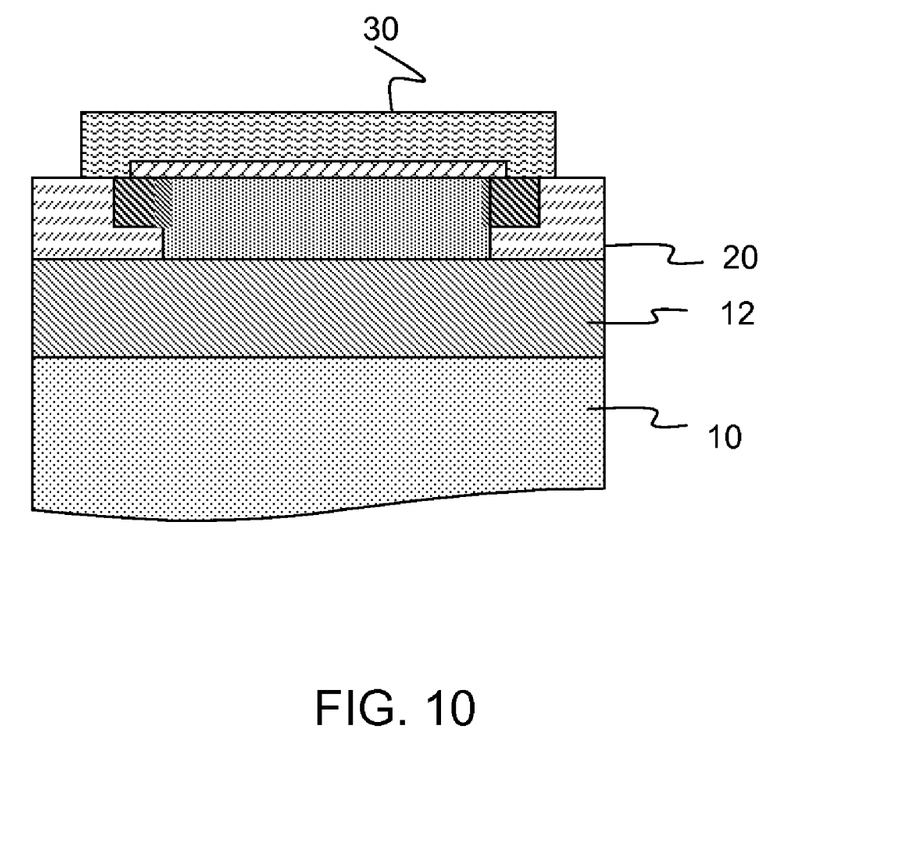

FIG. 10 shows the formation of the gate electrode stack 30. In embodiments, the gate electrode stack 30 is deposited and patterned in a conventional manner. In embodiments, the gate electrode stack 30 comprises TiN, AlTiN, or TaN with a doped poly and/or Al. Although not explicitly shown in FIG. 10, those of skill in the art should understand that FIG. 10 also represents a complete FET fabrication process using conventional processes. For example, FIG. 10 should be understood to include the following structures and respective processes/formations: sidewall spacer formation, extension/halo ion implantation, second spacer formation, deep source/drain implantation, annealing to form a silicide and back end of the line (BEOL) processes such as, for example, contacts and interconnects.

It should be understood by those of skill in the art that the structure shown in FIG. 10 is a single FET provided on a substrate. However, it is contemplated by the invention that more than one device can be formed on the substrate or higher levels. Also, in embodiments, the other devices may or may not include the leaky dielectric. For example, it is contemplated that structure further comprises a second FET devoid of a leaky dielectric.

Design Structure

Figure 11:
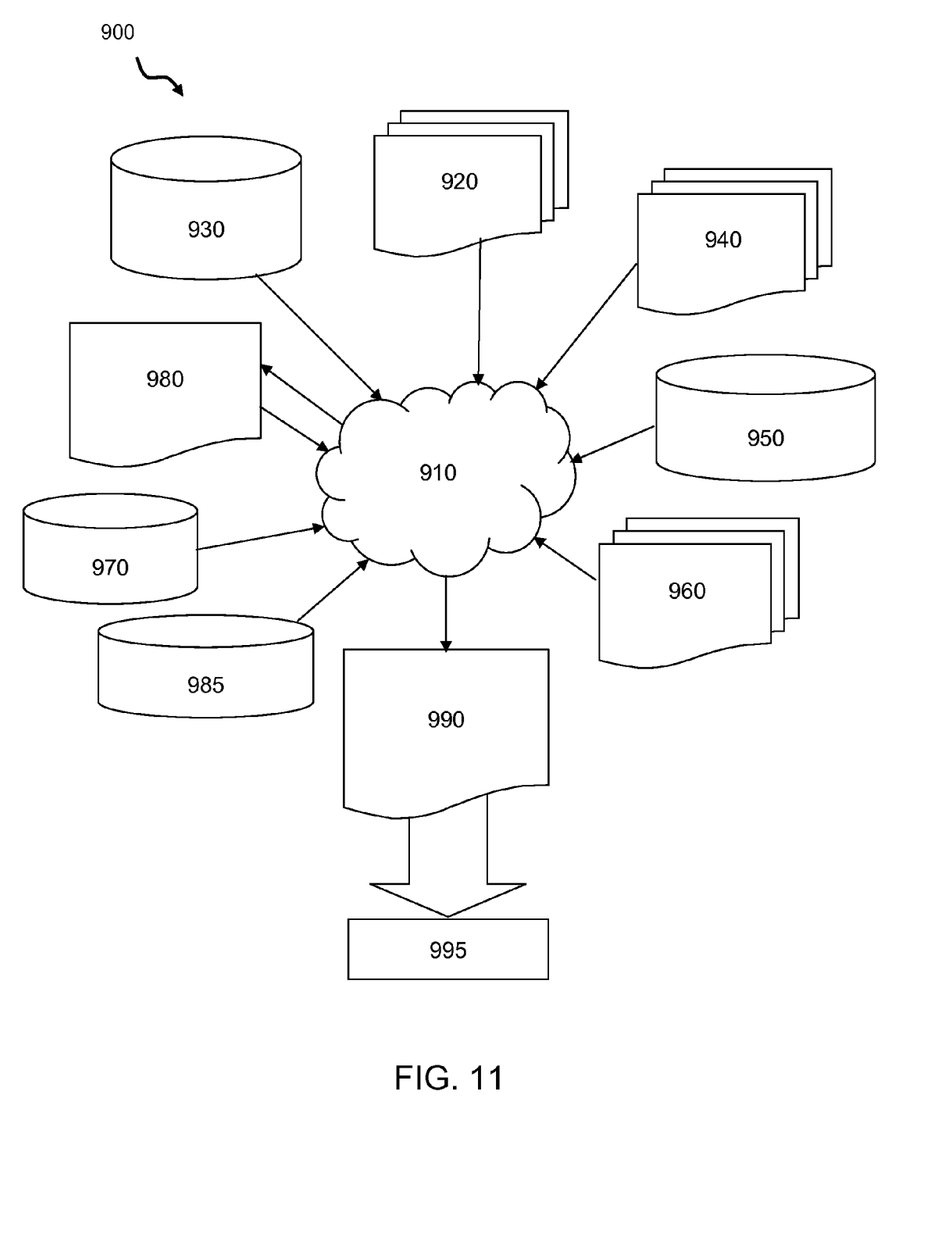
FIG. 11 is a flow diagram of a design process used in semiconductor design, manufacture, and/or test.

FIG. 11 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design from 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIG. 10 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIG. 10. Design process 910 preferably synthesizes (or translates) an embodiment of the invention as shown in FIG. 10 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIG. 10, along with any additional integrated circuit design or data (if applicable), into a second design structure 990. Design structure 990 resides on a storage medium in a data format used for the exchange of layout data of integrated circuits and/or symbolic data format (e.g., information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 10. Design structure 990 may then proceed to a stage 995 where, for example, design structure 990: proceeds to tape-out, is released to manufacturing, is released to a mask house, is sent to another design house, is sent back to the customer, etc.

The structures as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those of skill in the art will recognize that the invention can be practiced with modifications and in the spirit and scope of the appended claims.

What is claimed is:

1. A method, comprising:
    forming a shallow trench isolation (STI) structure on opposite sides of an active region of a device;
    forming recesses in the STI structure;
    forming a high-leakage dielectric on the active region such that the high-leakage dielectric is partially formed in the recesses of the STI structure;
    forming a gate electrode material in the recesses of the STI structure; and
    forming a low-leakage dielectric over the active region, a portion of the high-leakage dielectric partially formed in the recesses and a portion of the gate electrode material.

2. The method of claim 1, wherein the high-leakage dielectric is a silicon-oxynitride.

3. The method of claim 1, wherein the high-leakage dielectric is $SiO_2$—SiO—N.

4. The method of claim 1, wherein the high-leakage dielectric ranges in thickness of between approximately 0.7 to 2 nanometers.

5. The method of claim 1, further comprising forming a gate electrode stack over the low, leakage dielectric.

6. The method of claim 1, wherein the active region comprises silicon and the forming the high-leakage dielectric comprises selectively growing the high-leakage dielectric on the silicon such that the high-leakage dielectric is directly adjacent to the active region and abutting the STI structure.

7. The method of claim 6, wherein the portion of the high-leakage dielectric partially formed in the recesses is directly adjacent to opposite sidewalls of the active region.

8. The method of claim 7, wherein the low-leakage dielectric is formed directly on the active region, the portion of the high-leakage dielectric partially formed in the recesses and the portion of the gate electrode material.

9. A method of forming a structure for customizing history effects of a transistor, comprising:
    forming a first pad film on an active silicon layer;
    forming a second pad film on the first pad film;
    forming a resist on a portion of the second pad film;
    forming a first trench and a second trench in portions of the second pad film, the first pad film, and the active silicon layer that are not covered by the resist;
    forming a first shallow trench isolation (STI) structure in the first trench and a second STI structure in the second trench, wherein the first STI structure is adjacent to a first side of the active silicon layer and the second STI structure is adjacent to a second side of the active silicon layer;
    removing the first pad film and the second pad film, wherein incidental to removing the first pad film and the second pad film, a first recess is formed in the first STI structure and a second recess is formed in the second STI structure;
    forming a high-leakage dielectric on the active silicon layer such that the high-leakage dielectric is directly adjacent to the active silicon layer and abutting the first STI structure in a portion of the first recess and abutting the second STI structure in a portion of the second recess;
    forming a gate electrode material in a remaining portion of the first recess and a remaining portion of the second recess; and
    forming a low-leakage dielectric over the active silicon layer, a portion of the gate electrode material in the first recess, a portion of the gate electrode in the second recess, the high-leakage dielectric in the first recess, and the high-leakage dielectric in the second recess.

10. The method of claim 9, wherein the low-leakage dielectric is formed directly on the active silicon layer, a portion of the gate electrode material in the first recess, a portion of the gate electrode in the second recess, the high-leakage dielectric in the first recess, and the high-leakage dielectric in the second recess.

11. The method of claim 10, wherein the forming the high-leakage dielectric comprises selectively growing the high-leakage dielectric on the active silicon layer.

12. The method of claim 11, further comprising forming a gate electrode stack on the low-leakage dielectric and the gate electrode material in the remaining portion of the first recess and the remaining portion of the second recess.

* * * * *